United States Patent
Akiyama

(10) Patent No.: US 6,925,229 B2
(45) Date of Patent: Aug. 2, 2005

(54) WAVELENGTH CONTROLLABLE OPTICAL DEVICE AND LIGHT CONTROL METHOD

(75) Inventor: Tomoyuki Akiyama, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 156 days.

(21) Appl. No.: 10/350,266

(22) Filed: Jan. 24, 2003

(65) Prior Publication Data

US 2003/0174950 A1 Sep. 18, 2003

(30) Foreign Application Priority Data

Mar. 18, 2002 (JP) ........................................ 2002-074869

(51) Int. Cl.$^7$ ............................. G02B 6/34; G02F 1/335
(52) U.S. Cl. ........................................... 385/37; 385/7
(58) Field of Search ........................... 385/7, 9, 10, 37

(56) References Cited

U.S. PATENT DOCUMENTS

| | | | | |
|---|---|---|---|---|
| 5,452,314 A | * | 9/1995 | Aronson | ...................... 372/20 |
| 5,610,760 A | * | 3/1997 | Drenten et al. | .............. 359/332 |
| 5,664,032 A | * | 9/1997 | Bischel et al. | ................. 385/4 |
| 5,724,373 A | * | 3/1998 | Chang | .......................... 372/20 |
| 5,781,669 A | * | 7/1998 | Schmid et al. | ................. 385/7 |

* cited by examiner

*Primary Examiner*—John D. Lee
*Assistant Examiner*—James D. Stein
(74) *Attorney, Agent, or Firm*—Armstrong, Kratz, Quintos, Hanson & Brooks, LLP

(57) ABSTRACT

A first optical waveguide for guiding light is formed on a substrate. A surface acoustic wave transducer for generating a surface acoustic wave which propagates along a direction in which the first optical wave guide guides the light at least partial region of the first optical waveguide, is formed on the substrate. A wavelength variable laser oscillator can be formed which is easy to control and has a fast response speed.

13 Claims, 3 Drawing Sheets

WAVELENGTH CONTROLLABLE OPTICAL DEVICE AND LIGHT CONTROL METHOD

CROSS REFERENCE TO RELATED APPLICATION

This application is based on Japanese Patent Application No. 2002-074869, filed on Mar. 18, 2002, the entire contents of which are incorporated herein by reference.

BACKGROUND OF THE INVENTION

A) Field of the Invention

The present invention relates to a wavelength controllable optical device, and more particularly to a wavelength controllable optical device suitable for application to a wavelength variable laser oscillator.

B) Description of the Related Art

A sampled grating laser oscillator, a vertical cavity surface emitting laser (VCSEL) integrated with a micro electromechanical systems (MEMS) mirror, and the like are known as wavelength variable laser oscillators.

FIG. 3A is a schematic cross sectional view of a sampled grating laser oscillator. An active layer 100 is sandwiched between a lower clad layer 101 and an upper clad layer 102. Along a light propagation direction, a first reflector region 110, a gain region 111, a phase adjusting region 112 and a second reflector region 113 are defined.

In the first and second reflector regions 110 and 113, gratings 115 and 116 are formed at the interface between the active region 100 and lower clad layer 101. The gratings 115 and 116 have the structure that a distributed Bragg reflector (DBR) is cut off at a constant pitch, and peaks of the reflection spectrum are disposed at regular intervals.

The DBR cutting off period of the grating 115 of the first reflector region 110 is different from that of the grating 116 of the second reflector region 113. The pitches of peaks of the reflection spectra of the gratings 115 and 116 are therefore different. One of a plurality of peaks of the reflection spectrum of the first reflector region 110 is superposed upon one of the peaks of the reflection spectrum of the second reflector region 113. The laser oscillator oscillates at the wavelength where the two peaks are superposed.

Carriers are injected from a common electrode 120 into the active region 100 via the lower clad layer 101. Electrodes 121, 122, 123 and 124 are formed on the surfaces of the first reflector region 110, gain region 111, phase adjusting region 112 and second reflector mirror region 113, respectively of the upper clad layer 102. As carriers are injected from the electrode 121 on the surface of the first reflector region 110 into the active layer 100, the peak position of the reflection spectrum of the first reflector region 110 is shifted. Of the peaks of the reflection spectra of the first and second reflector regions 110 and 113, peaks are superposed which are different from the peaks superposed when carriers are not injected. Therefore, the oscillation wavelength of the laser oscillator changes.

A change in the oscillation wavelength has a discontinuity corresponding to about the pitches between a plurality of peaks of the reflection spectra of the first and second reflector regions 110 and 113. As current is injected from the electrode 123 on the surface of the phase adjusting region 112 into the active layer 100, a refractive index of the phase adjusting region 112 changes so that an effective optical resonator length changes. Fine adjustment of the oscillation wavelength of the optical resonator is therefore possible.

FIG. 3B is a schematic cross sectional view of a MEMS mirror integrated VCSEL. A recess is formed in the back surface layer of a semiconductor substrate 130 and an exciting laser oscillator 139 is mounted on the bottom surface of the recess (on the upper surface of the recess as viewed in FIG. 3B). On the principal surface of the semiconductor substrate 130, an active layer 131 and a cap layer 132 are stacked in this order.

An electrode 133 is formed on the surface of the cap layer 132. An opening 133a is formed through the electrode 133 above the exciting laser oscillator 139. A mirror holder 135 is mounted on the electrode 133 via a spacer 134. The mirror holder 135 is disposed above the electrode 133 at a position spaced apart from the electrode 133 by a predetermined distance. An opening 135a is formed through the mirror holder 135 at the position corresponding to the opening 133a. A mirror 138 covers the opening 135a. The mirror 138 and exciting laser oscillator 139 constitute an optical resonator.

As a d.c. voltage is applied across the electrode 133 and mirror holder 135, the distance between the mirror holder 135 and electrode 133 is shortened by a Coulomb force. Because the mirror 138 is displaced toward the semiconductor substrate 130 side, an optical resonator length is shortened. In this manner, by changing the optical resonator length, the oscillation wavelength can be changed.

The oscillation wavelength of the sampled grating laser oscillator can be changed almost continuously by shifting the peak position of the reflection spectrum of the reflector region 110 or 113 and changing the refractive index of the phase adjusting region 112. However, adjustment becomes complicated because the refractive indices of both one reflector region 110 and the phase adjusting region 112 are to be adjusted.

The MEMS mirror integrated VCSEL utilizes a mechanical structure for displacing the mirror. A response speed is therefore low in the order of several ms.

SUMMARY OF THE INVENTION

An object of this invention is to provide a wavelength controllable optical device capable of configuring a wavelength variable laser oscillator which is easy to control and has a fast response speed.

According to one aspect of the present invention, there is provided a wavelength controllable optical device, comprising: a first optical waveguide for guiding light, the first optical waveguide being formed on a substrate; and a surface acoustic wave transducer for generating a surface acoustic wave which propagates along a direction of guiding the light toward at least some region of the first optical waveguide, the surface acoustic wave transducer being formed on the substrate.

According to another aspect of the present invention, there is provided a light control method comprising steps of: propagating light in a first optical waveguide of a wavelength controllable optical device comprising: the first optical waveguide for guiding light, the first optical waveguide being formed on a substrate; and a surface acoustic wave transducer for generating a surface acoustic wave which propagates along a direction of guiding the light toward at least some region of the first optical waveguide, the surface acoustic wave transducer being formed on the substrate; and applying an a.c. voltage to the surface acoustic wave transducer to excite a surface acoustic wave.

A refractive index grating whose refractive index changes periodically is formed in the first optical waveguide because of the influence of a surface acoustic wave. This refractive index grating causes the light propagation characteristics of the first optical waveguide to have a wavelength dependency.

As above, by utilizing the interaction between an optical waveguide and a surface acoustic wave, the propagation characteristics of the optical waveguide can be made to have a wavelength dependency. By utilizing these characteristics, a wavelength variable laser oscillator can be manufactured.

DESCRIPTION OF THE PREFERRED EMBODIMENTS

Figure 1A:
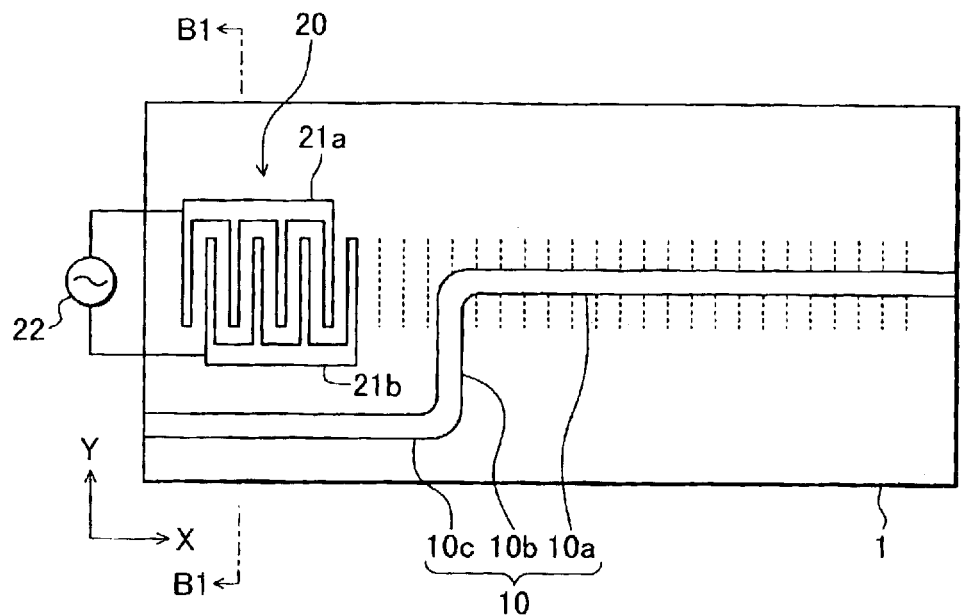
FIGS. 1A and 1B are a schematic plan view and a schematic cross sectional view of a wavelength variable laser oscillator according to a first embodiment of the invention.

A plan view of a wavelength variable laser oscillator according to a first embodiment of the invention is shown in FIG. 1A. On the surface of a substrate 1 of n-type InP, an optical waveguide 10 of InGaAsP is formed. The optical waveguide 10 is constituted of a linear first region 10a, a linear second region 10b and a linear third region 10c and has a width of about 3 µm. The first and third regions 10a and 10c extend in an X-axis direction (in a crosswise direction in FIG. 1A) and the second region 10b extends in a Y-axis direction (in a lengthwise direction in FIG. 1A). The first to third regions 10a to 10c are smoothly coupled in this order and have a plan shape like a crank bent at right angles. The lengths of the first to third regions 10a to 10c are 10 mm, 2 mm and 4 mm, respectively.

A high reflective film is formed on the end face of the optical waveguide 10 on the third region 10c side and a low reflective film is formed on the end face of the optical waveguide 10 on the first region 10a side. The reflective films on both end faces of the optical waveguide 10 constitute an optical resonator.

A surface acoustic wave transducer 20 is disposed along a straight line drawn by extending the first region 10a toward the connection side of the second region 10b. The surface acoustic wave transducer 20 includes a pair of comb electrodes 21a and 21b meshed with each other. Teeth of the comb electrodes 21a and 21b are disposed along the X-axis direction at an equal pitch of 40 µm. The width of each tooth is 20 µm. An a.c. power source applies a voltage having a predetermined frequency across the comb electrodes 21a and 21b.

Figure 1B:
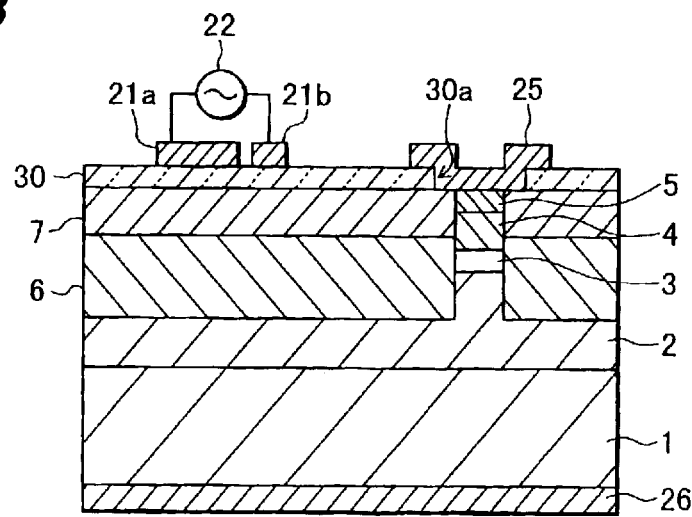

A cross sectional view taken along one-dot chain line B1—B1 shown in FIG. 1A is shown in FIG. 1B. On the principal surface of an n-type InP substrate 1, a lower clad layer 2 of n-type InP having a thickness of 2 µm, an active layer 3 of InGaAsP having a thickness of 100 nm, an upper clad layer 4 of p-type InP having a thickness of 2 µm and a contact layer 5 of p-type InGaAsP having a thickness of 400 nm are laminated in this order. These layers are formed, for example, by metal organic chemical vapor deposition (MO-CVD).

This lamination structure is mesa-etched to the intermediate depth of the lower clad layer 2 to leave a ridge-like structure having a plan shape corresponding to the optical waveguide 10 shown in FIG. 1A. This etching can be performed, for example, by dry-etching using $CF_4$ by using a silicon oxide film as a mask.

In the etched region, a first buried layer 6 of p-type InP having a thickness of 1.2 µm and a second buried layer 7 of n-type InP having a thickness of 2.3 µm are buried. The buried layers 6 and 7 may be formed by MOCVD. InP can be grown only in the etched region by covering the upper surface of the ridge structure with an insulating film of silicon oxide or the like used as the mesa-etching mask.

The InGaAsP active layer 3, whose upper, lower and side wall surfaces are surrounded by InP, constitutes the optical waveguide 10 shown in FIG. 1A.

A piezoelectric film 30 of zinc oxide (ZnO) having a thickness of 0.2 µm is formed on the second buried layer 7. For example, the piezoelectric film 30 can be formed by sputtering using a zinc oxide target. An opening 30a is formed through the piezoelectric film 30, exposing the upper surface of the contact layer 5.

The comb electrodes 21a and 21b are formed on the surface of the piezoelectric film 30 and an electrode 25 is formed on the bottom of the opening 30a. For example, the electrodes 21a, 21b and 25 are made of a lamination of Ti/Pt/Au. The electrode 25 is in ohmic contact with the contact layer 5.

Next, the operation principle of the wavelength variable laser oscillator shown in FIGS. 1A and 1B will be described. As an a.c voltage is applied across the comb electrodes 21a and 21b, a surface acoustic wave is excited in the piezoelectric film 30. The excited surface acoustic wave propagates along the X-axis direction shown in FIG. 1A. The first region 10a of the optical waveguide 10 is influenced by the surface acoustic wave so that a refractive index grating is formed whose refractive index changes periodically along the light propagation direction. The pitch of the refractive index grating is equal to the wavelength of the surface acoustic wave.

The refractive index grating functions in a manner similar to the grating of a distributed feedback (DFB) type laser oscillator so that light having the wavelength corresponding to the pitch of the refractive index grating is excited with a priority over other wavelengths. As the frequency of the a.c. voltage applied across the comb electrodes 21a and 21b is changed, the wavelength of the surface acoustic wave is also changed. By changing the frequency of the a.c. voltage, the oscillation frequency of the laser oscillator can be changed.

Generally, if the pitch of teeth of the comb electrodes 21a and 21b is made equal to a half wavelength of a surface acoustic wave to be excited, the surface acoustic wave can be excited most efficiently. In the first embodiment, although the pitch of teeth is fixed, a surface acoustic wave can be excited efficiently to a sufficient level if a deviation between the half wavelength of a surface acoustic wave and the pitch of teeth is about 8%.

A depth down to which a surface acoustic wave has influence is about 10 µm. In the first embodiment, a depth from the surface of the piezoelectric film 30 to the bottom of the active layer 3 is 2.7 µm so that the active layer 3 can be influenced sufficiently by a surface acoustic wave.

The frequency of the a.c. voltage of the a.c. power source 22 used in the first embodiment is about 50 MHz. It is easy to form a variable frequency driver circuit in such a frequency band. A time required for a surface acoustic wave to propagate through the first region 10a of the optical waveguide 10 is about 1 µs. The wavelength can therefore be changed at as high response speed as about 1 µs.

Figure 2:
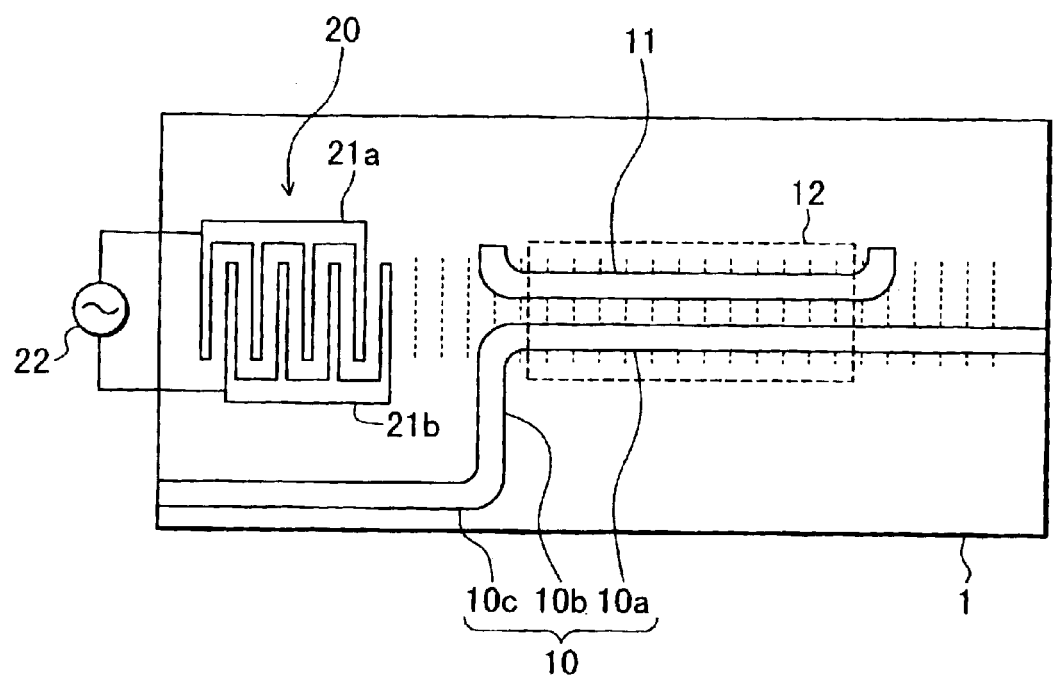
FIG. 2 is a schematic plan view of a wavelength variable laser oscillator according to a second embodiment of the invention.
Figure 3A:
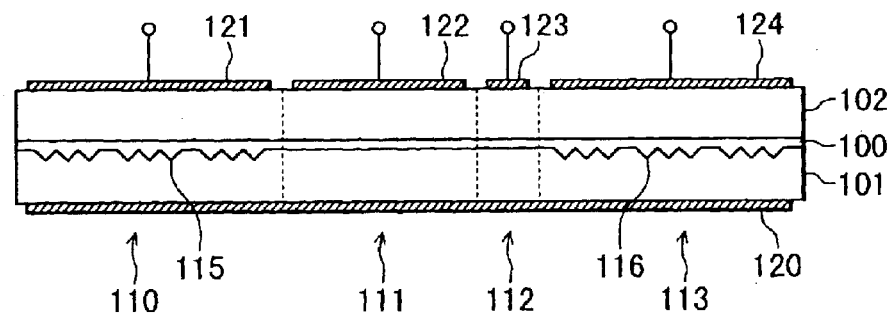
FIGS. 3A and 3B are cross sectional views of conventional wavelength variable laser oscillators.
Figure 3B:
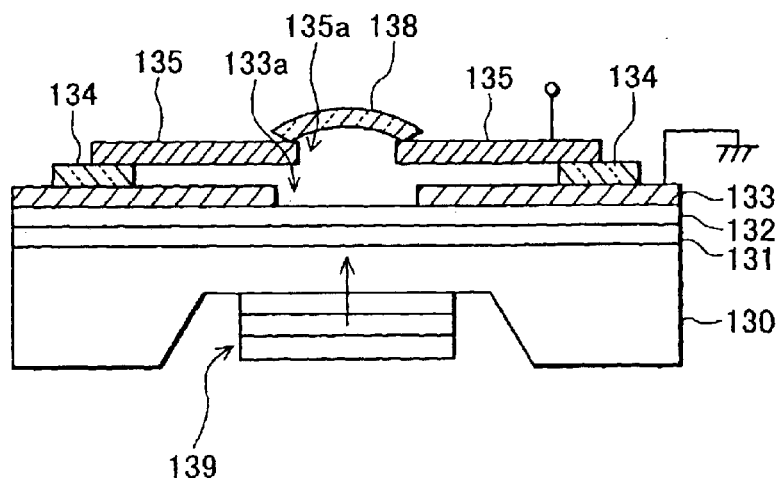

A schematic plan view of a wavelength variable laser oscillator according to a second embodiment is shown in FIG. 2. The structures of a semiconductor substrate 1, an optical waveguide 10 and a surface acoustic wave transducer 20 are similar to those of the wavelength variable laser oscillator of the first embodiment shown in FIG. 1A.

In the second embodiment, at the side of the first region 10a of the optical waveguide 10, another optical waveguide 11 is disposed. A distance between the optical waveguides 10 and 11 is about 1 μm and the two optical waveguides constitute a directional coupler 12. The optical waveguide 11 is formed by the same processes as those of forming the optical waveguide 10, and the lamination structures of the two optical waveguides are the same.

A surface acoustic wave excited by the surface acoustic wave transducer 20 propagates through the first region 10a of the optical waveguide 10 and through the region where the optical waveguide 11 is disposed.

A directional coupler 12 functions as a band-pass filter. The laser oscillator oscillates at the wavelength in the band-pass range of the band pass filter. The wavelength in the band-pass range of the band pass filter changes with the wavelength of a surface acoustic wave. Therefore, by changing the frequency of the a.c. voltage of the a.c power source 22 shown in FIG. 2, the oscillation frequency of the laser oscillator can be changed.

A wavelength variable laser oscillator of the second embodiment was manufactured and the output characteristics thereof were evaluated. The wavelength was able to change in the range of 1530 to 1560 nm and the side band suppression ratio was 30 dB.

In the above embodiments, although a laser oscillator of an InGaAsP series has been described, other compound semiconductors may be used as the materials of the active layer and clad layers. Although ZnO is used as the material of the piezoelectric film, other piezoelectric materials may also be used. In the above embodiments, a laser oscillator utilizing an interaction between an optical waveguide and a surface acoustic wave has been described. This interaction between an optical waveguide and a surface acoustic wave may be used not only for a laser oscillator but also for other devices which provide a wavelength dependency of the propagation characteristics of light propagating in an optical waveguide. For example, by utilizing this technique, a wavelength variable distributed Bragg reflector can be obtained.

The present invention has been described in connection with the preferred embodiments. The invention is not limited only to the above embodiments. It is apparent that various modifications, improvements, combinations, and the like can be made by those skilled in the art.

I claim:

1. A wavelength controllable optical device comprising:
a first optical waveguide for guiding light, said first optical waveguide being formed on or over a substrate; and
a surface acoustic wave transducer for generating a surface acoustic wave which propagates along a direction in which the first optical wave guide guides the light in at least a partial region of the first optical waveguide, the surface acoustic wave transducer being formed on or over the substrate,
wherein the first optical waveguide has an optical gain.

2. A wavelength controllable optical device comprising:
a first optical waveguide for guiding light, said first optical waveguide being formed on or over a substrate; and
a surface acoustic wave transducer for generating a surface acoustic wave which propagates along a direction in which the first optical wave guide guides the light in at least a partial region of the first optical waveguide, the surface acoustic wave transducer being formed on or over the substrate,
wherein the first optical waveguide comprises a semiconductor layer which has an optical gain when current is injected into the semiconductor layer from an external, and in a light radiation wavelength range of the semiconductor layer, a reflectivity of one end of the first optical waveguide is smaller than a reflectivity of the other end.

3. The wavelength controllable optical device according to claim 2,
wherein opposite ends of the first optical waveguide are reflective surfaces for reflecting at least a portion of light propagating in the first optical waveguide.

4. A wavelength controllable optical device according to claim 1, further comprising a second optical waveguide disposed at a side of the first optical waveguide in an area where the surface acoustic wave propagates, the second optical waveguide together with the first optical waveguide constituting a directional coupler.

5. A wavelength controllable optical device according to claim 1, wherein the first optical waveguide comprises a linear first region and a linear second region continuous with a first end of the linear first region and extending along a direction crossing the first region, and the surface acoustic wave transducer is disposed on a straight line drawn by extending the first region toward the first end and generates the surface acoustic wave propagating along a direction along which the first region extends.

6. A wavelength controllable optical device according to claim 1, wherein the surface acoustic wave transducer excites a surface acoustic wave having a frequency corresponding to a frequency of an a.c. voltage applied from an external, and the wavelength controllable optical device further comprises a frequency variable a.c. power source for applying the a.c. voltage to the surface acoustic wave transducer.

7. A wavelength controllable optical device according to claim 3, further comprising a second optical waveguide disposed at a side of the first optical waveguide in an area where the surface acoustic wave propagates, the second optical waveguide together with the first optical waveguide constituting a directional coupler.

8. A wavelength controllable optical device according to claim 3, wherein the first optical waveguide comprises a linear first region and a linear second region continuous with a first end of the linear first region and extending along a direction crossing the first region, and the surface acoustic wave transducer is disposed on a straight line drawn by extending the first region toward the first end and generates the surface acoustic wave propagating along a direction along which the first region extends.

9. A wavelength controllable optical device according to claim 3, wherein the surface acoustic wave transducer excites a surface acoustic wave having a frequency corresponding to a frequency of an a.c. voltage applied from an external, and the wavelength controllable optical device further comprises a frequency variable a.c. power source for applying the a.c. voltage to the surface acoustic wave transducer.

10. A wavelength controllable optical device according to claim 2, further comprising a second optical waveguide disposed at a side of the first optical waveguide in an area where the surface acoustic wave propagates, the second optical waveguide together with the first optical waveguide constituting a directional coupler.

11. A wavelength controllable optical device according to claim 2, wherein the first optical waveguide comprises a linear first region and a linear second region continuous with a first end of the linear first region and extending along a direction crossing the first region, and the surface acoustic wave transducer is disposed on a straight line drawn by extending the first region toward the first end and generates the surface acoustic wave propagating along a direction along which the first region extends.

12. A wavelength controllable optical device according to claim 2, wherein the surface acoustic wave transducer excites a surface acoustic wave having a frequency corresponding to a frequency of an a.c. voltage applied from an external, and the wavelength controllable optical device further comprises a frequency variable a.c. power source for applying the a.c. voltage to the surface acoustic wave transducer.

13. A wavelength controllable optical device according to claim 3, wherein the opposite ends of the first optical waveguide constitute an optical resonator.

* * * * *